(12) United States Patent
Muramatsu et al.

(10) Patent No.: US 6,730,859 B2
(45) Date of Patent: May 4, 2004

(54) SUBSTRATE FOR MOUNTING ELECTRONIC PARTS THEREON AND METHOD OF MANUFACTURING SAME

(75) Inventors: Shigetsugu Muramatsu, Nagano (JP); Kazunari Imai, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/817,947

(22) Filed: Mar. 27, 2001

(65) Prior Publication Data

US 2001/0023781 A1 Sep. 27, 2001

(30) Foreign Application Priority Data

Mar. 27, 2000 (JP) .......................................... 2000-86857

(51) Int. Cl.[7] ........................... H01R 12/04; H05K 1/11
(52) U.S. Cl. ........................... 174/262; 174/255; 29/837
(58) Field of Search ..................... 174/260, 261–266, 174/255; 361/767–771

(56) References Cited

U.S. PATENT DOCUMENTS

| 5,079,065 A | | 1/1992 | Masakazu et al. ........... 428/137 |
|---|---|---|---|
| 5,199,879 A | * | 4/1993 | Kohn et al. .................. 439/63 |
| 5,487,218 A | | 1/1996 | Bhatt et al. .................. 29/852 |
| 5,665,525 A | | 9/1997 | Pienimaa .................... 430/315 |
| 5,690,270 A | * | 11/1997 | Gore ....................... 228/180.22 |
| 5,730,932 A | * | 3/1998 | Sarkhel et al. .............. 420/562 |
| 5,826,330 A | | 10/1998 | Isoda et al. ................... 29/852 |
| 6,027,858 A | | 2/2000 | Jones et al. ................. 430/311 |
| 6,271,480 B1 | * | 8/2001 | Yamaguti et al. ........... 174/260 |
| 6,307,161 B1 | * | 10/2001 | Grube et al. ................ 174/260 |
| 6,392,160 B1 | * | 5/2002 | Andry et al. ............... 174/261 |
| 6,400,573 B1 | * | 6/2002 | Mowatt et al. ............. 174/252 |

FOREIGN PATENT DOCUMENTS

| EP | 0568311 | 11/1993 |
|---|---|---|
| GB | 1042234 | 9/1966 |
| JP | 10041605 | 2/1998 |

* cited by examiner

Primary Examiner—David A. Zarneke
Assistant Examiner—Jeremy Norris
(74) Attorney, Agent, or Firm—Paul & Paul (57) ABSTRACT

A substrate for mounting an electronic part or parts thereon, which comprises a core substrate and at least a set of insulation layer and patterned wiring line layer, which is formed on the insulation layer, at at least one side of the core substrate, the core substrate having holes, in each of which a lead pin of the electronic part to be mounted is to be inserted, and being provided with lands which surround the opening of the hole and to which the lead pin inserted in the hole is to be bonded, wherein the insulation layer or layers at at least one side of the core substrate has bores, which expose the land at their bottoms, and communicate with the hole. A method of manufacturing such a substrate is also disclosed.

17 Claims, 7 Drawing Sheets

SUBSTRATE FOR MOUNTING ELECTRONIC PARTS THEREON AND METHOD OF MANUFACTURING SAME

BACKGROUND OF THE INVENTION

1. Field of the Invention

The invention relates to a substrate for mounting an electronic part or electronic parts thereon, the substrate having a laminate structure of an insulation layer and a patterned wiring line layer on each side of a core substrate, and a method of producing the mounting substrate.

2. Description of the Related Art

As an electronic part-mounting substrate having a high density of patterned wiring lines, a substrate having patterned wiring lines formed at both sides of a core substrate, such as a glass-epoxy substrate, made by a build-up process, is known. On such an electronic part-mounting substrate, electronic parts, such as resistors and capacitors, semiconductor elements, and semiconductor devices having a packaged semiconductor element, may be mounted.

Figure 7:
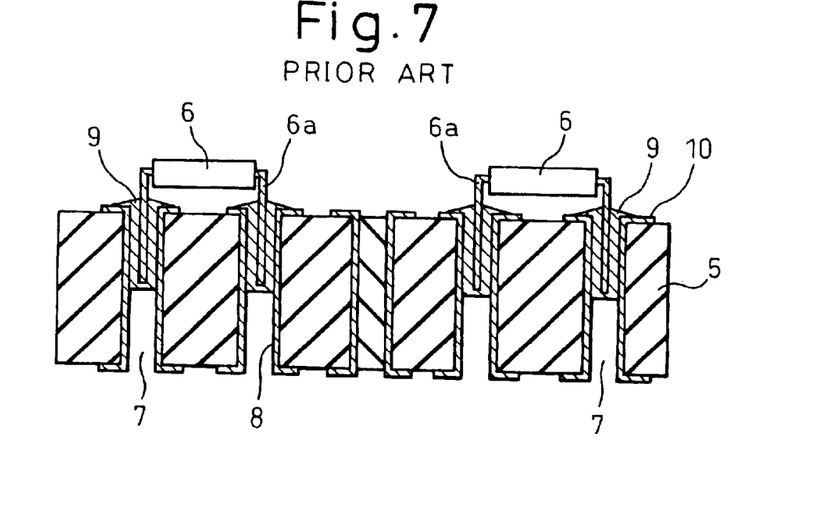
FIG. 7 is an illustration of a conventional substrate on which electronic parts are mounted.

FIG. 7 illustrates an example of a printed-circuit board 5 on which electronic parts 6 are mounted. Lead pins 6a are inserted in holes 7 which are formed in the printed-circuit board 5 and have conductor layers 8 formed on their inside walls. The conductor layer 8 extends over the surface of the board 5 to thereby form a land 10. The lead pin 6a is bonded to the conductor layer 8 and the land 10 by solder 9. The formation of the conductor layer 8 and the land 10 is performed by a plating process. The board 5 may have patterned wiring lines on a surface or surfaces thereof, although such wiring lines are not shown in the drawing.

Figure 8:
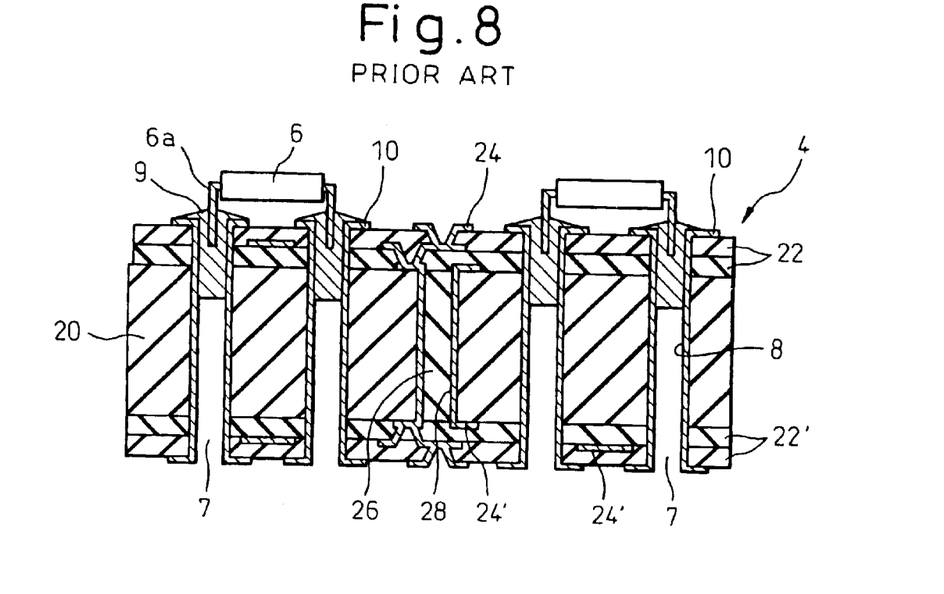
FIG. 8 is an illustration of another conventional substrate having two layers of patterned wiring lines 24 formed at each of two sides of a core substrate, by a build-up process.

FIG. 8 illustrates an example of prior substrate 4 having two layers of patterned wiring lines 24 (or 24') formed at each of two sides of a core substrate 20, so as to be formed on an insulation layer 22 (or 22'), which isolate an underlying layer of wiring line and an overlaying layer of wiring line, by a build-up process, and having electronic parts 6 mounted thereon. The patterned wiring lines 24 at one side of the substrate 4 are electrically connected to the patterned wiring lines 24' at another side by through holes having a structure made up of a hole 26 piercing through the core substrate 20 and a conductor layer 28 formed on the inside wall of the hole 26. Holes 7 in which lead pins 6a are to be inserted are formed so as to pierce through the core substrate 20 as well as the insulation layers 22, 22', and have conductor layers 8 formed on the inside walls thereof. The lead pins 6a inserted in the holes 7 are bonded to the conductor layer 8 and lands 10, 10', which are formed around the opening of the holes 7, by solders 9.

Figure 9A:
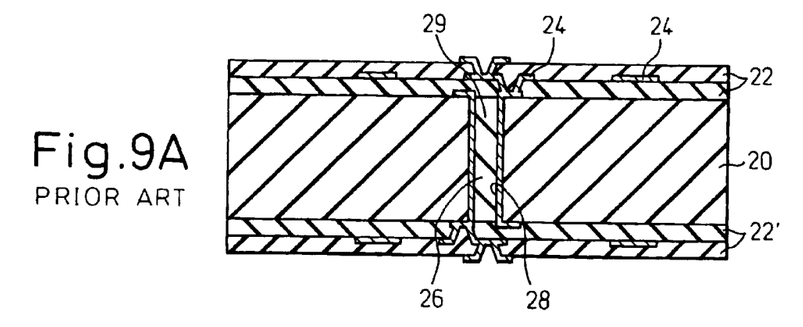
FIGS. 9A to 9C illustrate the manufacture of the substrate shown in FIG. 8.
Figure 9B:
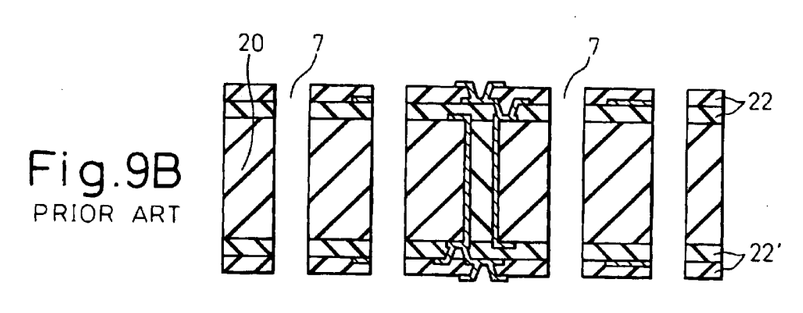
Figure 9C:
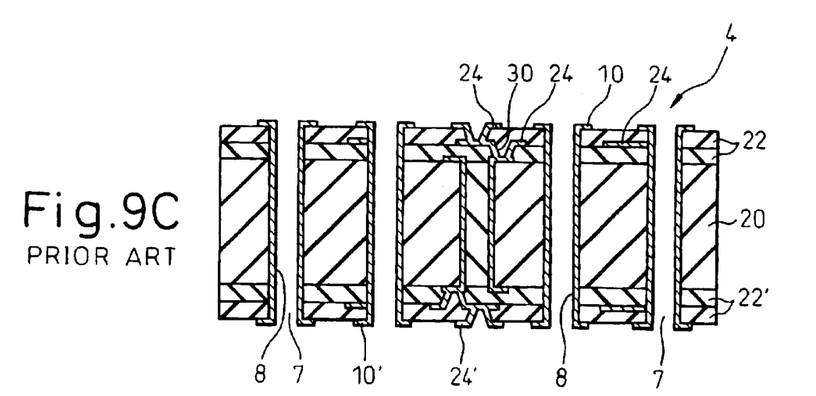

FIGS. 9A to 9C show the manufacture of the mounting substrate 4 illustrated in FIG. 8. Referring to FIG. 9A, patterned wiring lines 24 are formed on both sides of a core substrate 20, so as to be formed on an insulation layer 22, 22', by a conventional build-up process. The patterned wiring lines 24 at one side of the substrate 4 are connected to the patterned wiring lines 24' at another side by a conductor layer 28 formed on the inside wall of a hole 26 piercing through the core substrate 20. The hole 26 is filled with a resin material prior to the formation of the insulation layers 22, 22' located directly on the surfaces of the core substrate 20, or is filed with a resin material of a film to be laminated to the core substrate 20 for the formation of the insulation layer 22, 22' located directly on the surfaces of the core substrate 20.

The core substrate 20 provided with the insulation layers 22, 22' and the patterned wiring lines 24, 24' is then drilled to have holes 7 piercing through the core substrate 20 and the insulation layers 22, 22' at both sides of the core substrate 20, in which holes lead pins 6a of electronic parts 6 (FIG. 8) are subsequently inserted, as illustrated in FIG. 9B.

After the formation of the holes 7, the core substrate 20 is subjected to successive electroless plating and electroplating with copper to have conductor layers 8 on the inside walls of the holes 7 and lands 10, 10' on the surfaces of the outermost insulation layers 22, 22'. The lands 10, 10' are formed by patterning conductor layers plated on the outermost insulation layers 22, 22' by an etching process. Concurrently with the formation of the lands 10, 10', patterned wiring lines may be formed from the conductor layers on the outermost insulation layers 22, 22'.

In the substrate 4 for mounting electronic parts described above, a material, such as a polyimide or epoxy resin, is used for the insulation layers 22, 22', and a material, such as a glass-epoxy composite material, is used for the core substrate 20. As a consequence of the difference in materials used for the core substrate and the insulation layers, there is a problem that highly precise formation of holes 7, in which lead pins of electronic parts are to be inserted, by drilling or the like, is difficult. Since in a recent circuit board, miniaturized semiconductor elements and parts are arranged at high density, high precision is needed for the arrangement and sizing of the holes for the insertion of the lead pins, and high precision in making the holes for the insertion of the lead pins is required.

When the plated conductor layer 8 is formed on the inside wall of the hole 7 piercing through the core substrate 20 and the insulation layers 22, 22', as shown in FIG. 9C, the plated layer 8 has a large thickness to a certain extent. Under the circumstances, the formation of a very small pattern of wiring lines is difficult when the wiring lines are formed, concurrently with the formation of the conductor layer 8 on the inside wall of the hole 7, by patterning the plated conductor layers on the surfaces of the outermost insulation layers 22, 22' by etching. Although it is possible to form patterns of wiring lines in a high density on the surfaces of the insulation layers 22, 22' by such a process in which the outer surfaces of the insulation layers 22, 22' are masked during the plating of the inside walls of the holes 7 for the insertion of lead pins, and the holes 7 are then filled with a resist or the like during the formation of conductor layers for the patterned wiring lines on the surfaces of the insulation layers 22, 22' by plating, or a process in which the insulation layers on the surfaces of the outermost insulation layers 22, 22', which have been formed during the plating of the insides of the holes 7, are removed by grinding, and fresh insulation layers for the formation of patterned wiring lines are then formed on the surfaces of the insulation layers 22, 22', these processes are complicated.

SUMMARY OF THE INVENTION

It is an object of the invention to solve the above problems by providing a substrate for mounting electronic parts, which enables electronic parts, such as resistors and capacitors, to be mounted thereon by inserting their lead pins in holes of the substrate, and in which the holes for the insertion of the lead pins can be formed with high precision, and patterned wiring lines can be formed at high density.

It is also an object of the invention to provide a method appropriate for the production of the substrate for mounting electronic parts of the invention.

The substrate for mounting an electronic part or electronic parts thereon according to the invention comprises a core substrate and at least a set of an insulation layer and a patterned wiring line layer, which is formed on the insulation layer, at at least one side of the core substrate, the core substrate having holes, in each of which a lead pin of the electronic part to be mounted is to be inserted, and being provided with lands which surround the opening of the hole and to which the lead pin inserted in the hole is to be bonded, wherein the insulation layer or layers at at least one side of the core substrate has bores, which expose the land at their bottoms, and communicate with the hole.

In an embodiment of the invention, the hole, in which the lead pin of the electronic part is to be inserted, has an inside wall on which a conductor layer is formed. The conductor layer is led to the land to which the lead pin is bonded. The core substrate may have lands which surround the opening of the hole at the side of the core substrate opposed to the side on which the electronic parts are to be mounted, and the conductor layer may be also led to these lands. The land at the side of the core substrate opposed to the side on which the electronic parts are to be mounted can be connected to a wiring line at this side.

The substrate according to the invention may have the holes, in which the lead pin of the electronic part is to be inserted, having an open end at the side of the core substrate opposed to the side on which the electronic parts are to be mounted. The substrate according to the invention may also have the holes, in which the lead pin of the electronic part is to be inserted, having an closed end at the side of the core substrate opposed to the side on which the electronic parts are to be mounted. The end of the hole at the side of the core substrate opposed to the side on which the electronic parts are to be mounted may be closed by the insulation layer on the core substrate, a metal layer provided at the end of the hole, or a metal film formed during the formation of the wiring line layer. In the substrate having the holes with the closed end, a wiring line can be provided on the insulation layer at an area corresponding to the location of the hole with the closed end.

The substrate according to the invention may have a hole piercing through the core substrate and having an inside wall on which an conductor layer is provided to connect a wiring line at one side of the core substrate to another wiring line at the opposed side.

The substrate according to the invention can be manufactured by a method comprising the steps of providing a core substrate, forming holes piercing the core substrate, forming, on the core substrate and around the ends of the holes, lands for the connection with the lead pin of the electronic parts to be mounted, filling the holes with a filling material, such as a resin, forming at least a set of an insulation layer and a patterned wiring line layer, which is formed on the insulation layer, at at least one side of the core substrate, by a build-up process, forming bores piercing through the resultant insulation layer or layers and exposing the land at their bottom, and removing the filling material in the holes to allow each of them to communicate with each of the bores.

The formation of the bores and the removal of the filling material in the holes may be carried out using a laser beam. The formation of the bores and the removal of the filling material in the holes may be also carried out by chemical etching.

BRIEF DESCRIPTION OF THE DRAWINGS

The above and other objects and advantages of the invention will be understood and appreciated by a person with ordinary skill in the art, from consideration of the following detailed description made by referring to the attached drawings wherein.

DETAILED DESCRIPTION OF THE INVENTION

Figure 1:
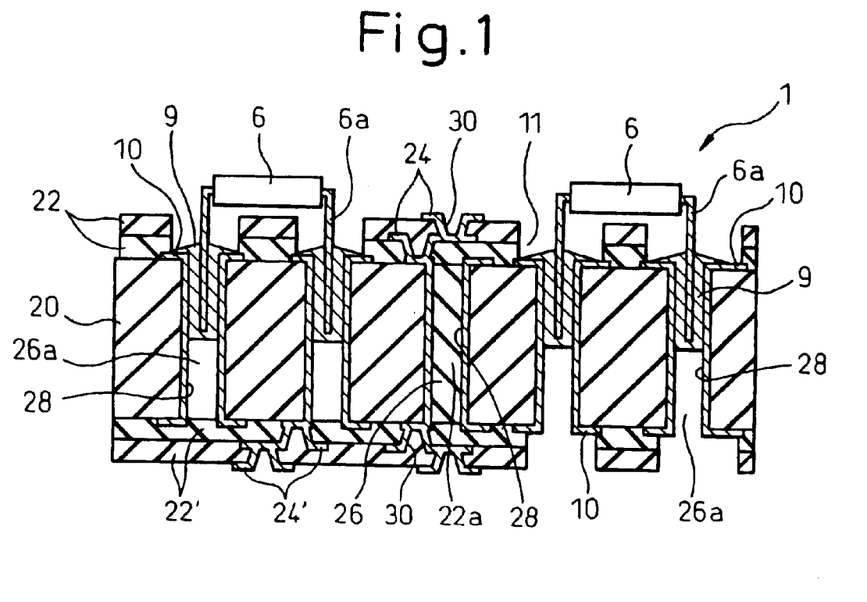
FIG. 1 is an illustration of a substrate according to the invention, on which electronic parts are mounted.

FIG. 1 is an illustration of a substrate 1 for mounting electronic parts thereon, according to an embodiment of the invention, on which electronic parts 6 are mounted. Patterned wiring lines 24, 24' are formed so as to be superimposed on an electrical insulation layer 22, 22' at both sides of a core substrate (base) 20. Lead pins 6a of the electronic parts 6 are inserted in holes 26a provided in the core substrate 20, and the electronic parts 6 are mounted on the substrate 1 by soldering. A characteristic feature in the substrate 1 of this embodiment is the fact that the holes 26a for the insertion of the lead pins 6a of the electronic parts 6 are formed in the core substrate 20, and lands 10, to which the lead pins 6a are to be bonded by soldering, are formed on the top surface of the core substrate 20 so as to surround the top openings or ends of the holes 26a for the insertion of the lead pins 6a. The insulation layers 22 has apertures to form bores 11 at the sites at which the lands 10 are formed, and the lands are located at the bottoms of the bores 11. In the embodiment shown in FIG. 1, lands are also provided around the bottom openings or ends of the holes 26a.

A conductor layer 28 is formed on the inside wall of the hole 26a in which the lead pin 6a is to be inserted. The conductor layer 28 is led to the land at the top surface of the core substrate 20 as well as to the land at the bottom surface of the core substrate. The conductor layer 28 may be connected through the land at the bottom surface of the core substrate 20 to the wiring lines 24' formed at the side of the core substrate 20 opposed to the side thereof on which the parts 6 are mounted. The land 10 is located at the periphery portion of the opening of the hole 26a and on the surface of the core substrate 20. The hole 26a has a smaller diameter than the outer diameter of the land 10. In the embodiment shown in FIG. 1, part of solder material 9 enters the hole 26a to some extent during a soldering process, to thereby bond the lead pin 6a to the conductor layer 28 and the land 10, and the remainder of the solder material 9 remains in the bore 11 and, consequently, a short-circuit between adjacent lead pins 6a through the solder 9 is certainly prevented.

The lead pin 6a is bonded to the conductor layer 28 only at one side of the hole 26a provided in the core substrate 20. Accordingly, the hole 26a at another side can be opened by removing the insulation layers 22', or can be closed without removing the insulation layer 22'. FIG. 1 shows both holes having open ends and holes having closed ends at the side opposed to the side at which the parts 6 are mounted. With the holes 26a having open ends at the side opposed to the side at which the parts 6 are mounted, the electronic part 6 may have lead pins running through the holes 26a to the opposed side. With the holes 26a having closed ends at the side opposed to the side at which the parts 6 are mounted, wiring lines 24' can be formed on the insulation layers 22' closing the ends of the holes 26a.

The substrate 1 also has a hole 26, which pierces through the core substrate 20 for the connection of a wiring line 24 at one side of the core substrate 20 and a wiring line 24' at the other side, and has a conductor layer 28 on the inside wall thereof. This hole 28 may be called a through hole. Constructions of the hole 26 piercing through the core substrate 20 and the conductor layer 28 on the inside wall thereof are the same as those in the prior circuit board having wiring lines at both sides of a core substrate.

Figure 2:
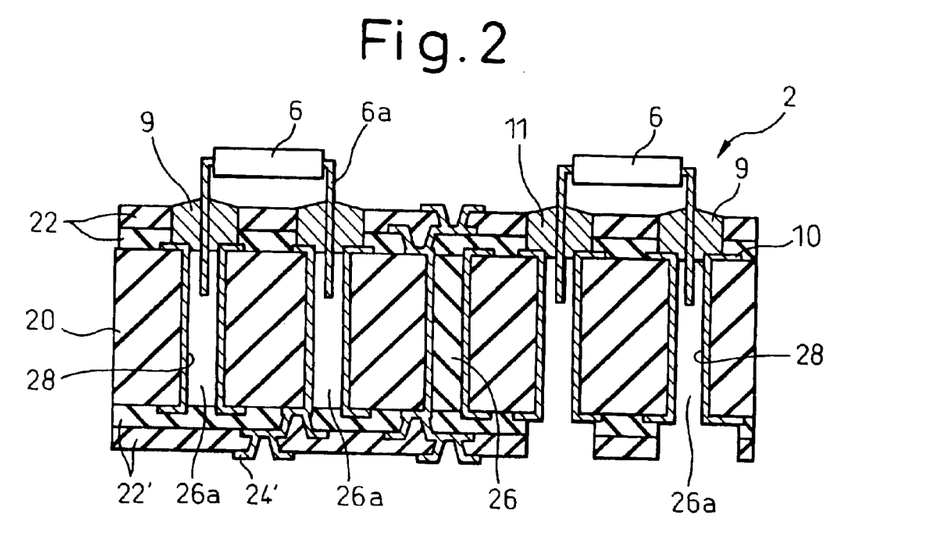
FIG. 2 is an illustration of another substrate according to the invention, on which electronic parts are mounted.

FIG. 2 is an illustration of a substrate 2 for mounting electronic parts thereon according to another embodiment of the invention, on which electronic parts 6 are mounted. In this embodiment, solder 9 is filled in bores 11 having a bottom at which a land 10 is located, projecting over the surface of the top insulation layer 22 to form a meniscus surface, and bonds lead pins 6a of parts 6 mounted on the substrate 2 to the lands 10. In this case, the solder 9 filled in the entire bore 11 can enhance the strength of the bond between the land 10 and the lead pin 6a. The solder 9 may not flow into the holes 26a.

Figure 3:
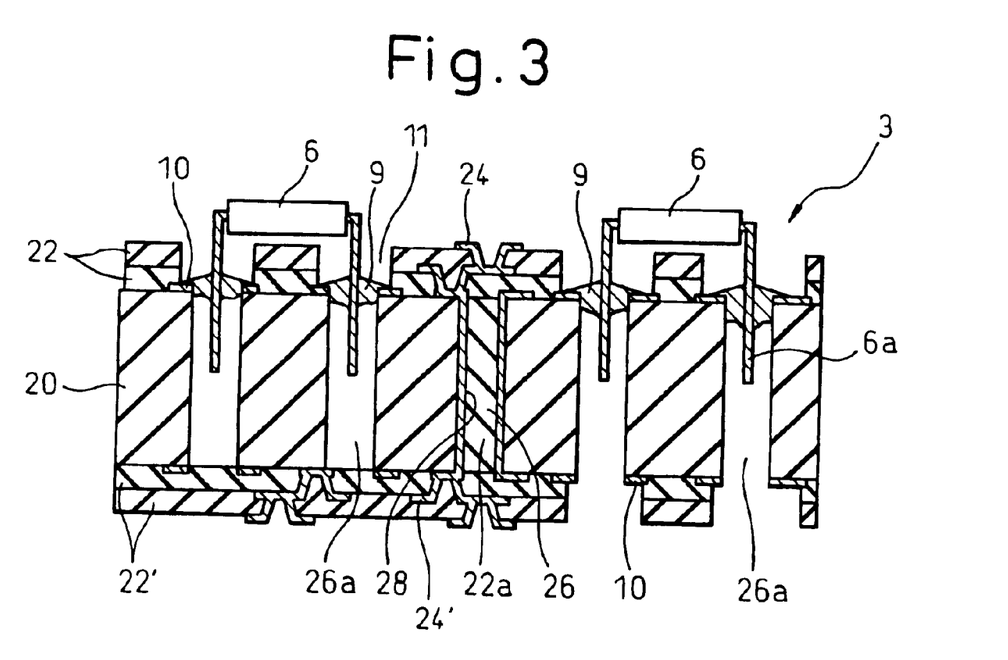
FIG. 3 is an illustration of a further substrate according to the invention, on which electronic parts are mounted.

FIG. 3 shows a substrate 3 for mounting electronic parts thereon according to a further embodiment of the invention, on which electronic parts 6 are mounted. In this embodiment, patterned wiring lines 24, 24' are formed so as to be superimposed on an insulation layer 22, 22' at both sides of a core substrate 20, as in the embodiments illustrated in FIGS. 1 and 2. Lead pins 6a of the electronic parts 6 are inserted in holes 26a provided in the core substrate 20, and are bonded to lands 10 surrounding the openings of the holes 26a by solder 9. A characteristic feature in the substrate 1 of this embodiment is the fact that a hole 26 piercing through the core substrate 20 is provided on its inside wall with a conductor layer 28 to form a through hole, to thereby make it possible to connect the wiring line 24 at one side of the substrate 1 to the wiring line 24' at another side, while the holes 26a, in which pins 6a of the parts 6 are to be inserted, are not provided on their inside wall with a conductor layer. In the case where there is no need for the holes 26a for the insertion of lead pins 6a of the parts 6 to have a function of electrically connecting the wiring lines 24, 24' at both sides of the substrate 3 to each other, it is sufficient for the substrate 3 to be provided with the lands 10 surrounding the openings of the holes 26a and located on the surface of the core substrate 20, as in this embodiment.

Figure 4A:
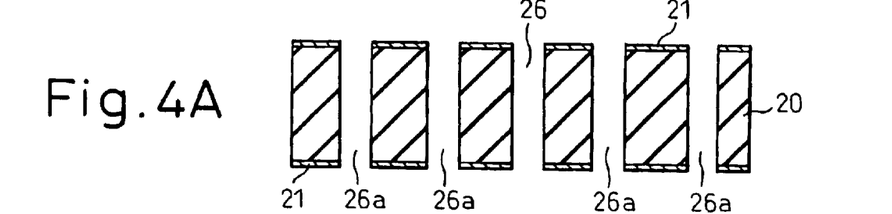
FIGS. 4A to 4E illustrate steps in the formation of alternating insulation layer and wiring line layer.
Figure 4B:
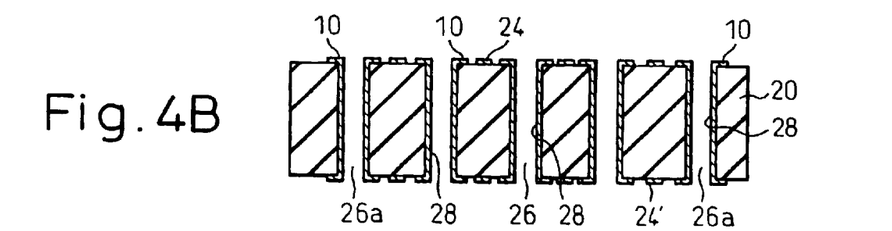
Figure 4C:
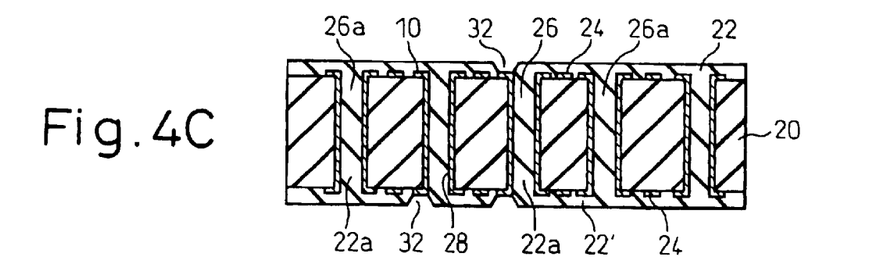
Figure 4D:
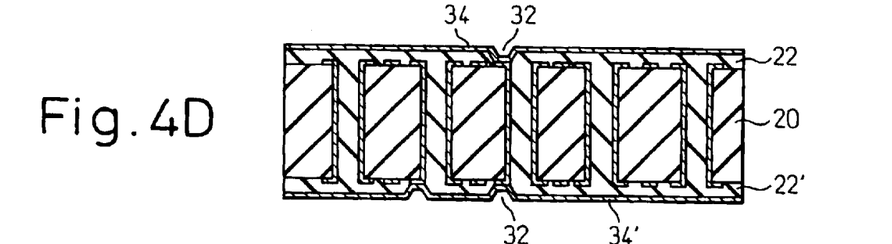
Figure 4E:
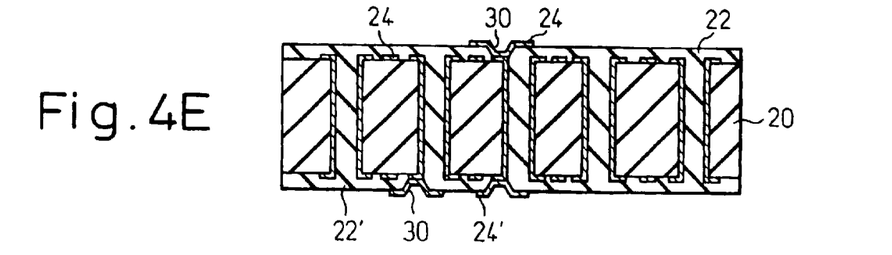
Figure 5A:
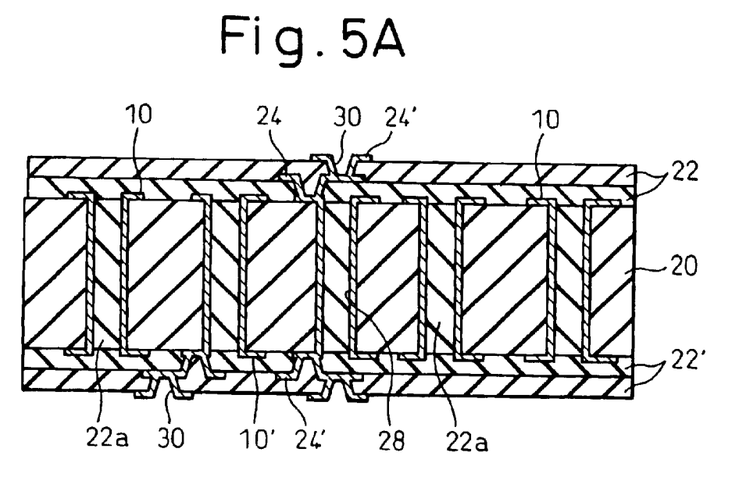
FIG. 5A illustrates a core substrate provided on each side thereof with two sets of insulation layer and wiring line layer.
Figure 5B:
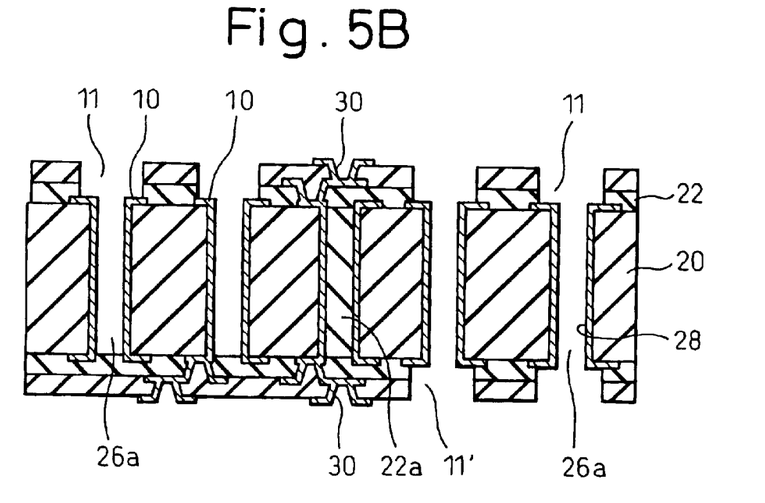
FIG. 5B illustrates a substrate produced according to the invention.

FIGS. 4 and 5 illustrate the manufacture of the substrate 1 or 2 described with reference to FIG. 1 or 2, which has the conductor layer on the inside wall of the holes in which the lead pins of the mounted electronic parts are to be inserted.

FIG. 4A shows a core substrate 20 provided on each surface thereof with a copper foil 21, and having a hole 26 piercing through the core substrate 20 for the connection of a wiring line at one side to a wiring line at another side and holes 26a in which lead pins of mounted electronic parts are to be inserted. Examples of the electronic parts to be mounted include resistors, capacitors, coils, and connectors. The holes 26 and 26a may be formed by drilling or laser beam machining. The holes 26 and 26a may have the same diameter or may have diameters different from each other.

Subsequently to the formation of the holes 26 and 26a, conductor layers 28 are formed on the inside wall of the holes 26 and 26a, and wiring patterns 24, 24' and lands 10 are formed on two surfaces of the core substrate 20, as shown in FIG. 4B. The conductor layer 28 can be formed by forming a first layer of copper by electroless plating, and then electroplating the first layer with copper using the first layer as an electric power-supplying layer. In the case where no conductor layers are formed on the inside wall of the holes 26a in which the lead pins of the mounted parts are to be inserted, as in the embodiment illustrated in FIG. 3, or the case where some of the holes 26a are selectively left having the inside wall provided with no conductor layer, all (in the former case) or some (in the latter case) of the holes 26a may be blocked with a material, such as a resist material, during the formation of the conductor layers 28.

During the formation of the conductor layers 28 on the inside walls of the holes 26 and 26a, a conductor layer can be simultaneously formed on the foil 21 of the two surfaces of the core substrate 20. In a following patterning process, the conductor layer on the foil 21 can be etched along with the underlying foil 21 to have a certain pattern to thereby provide the patterned wiring lines 24, 24' and the lands 10 on the surface of the core substrate 20. For the formation of the patterned wiring lines 24, 24' and lands 10, one may apply a photosensitive resist to the surface of each of the conductor layers on the foils 21 to form a resist film, subject the resist film to exposure and development processes to thereby form resist pattern covering the sites at which the wiring lines 24, 24' and the lands 10 are to be formed, and etch the conductor layer using the resist pattern as a mask. In this case, the holes 26 and 26a are also filled with the photosensitive resist or another resinous material, and the material in the holes 26 and 26a is removed after the formation of the patterned wiring lines 24, 24'.

Subsequently, alternating insulation layers and wiring layers are formed on both sides of the core substrate 20 by a build-up process, which is illustrated in FIGS. 4C to 4E.

Referring to FIG. 4C, each side of the core substrate 20 is covered with an insulation layer 22 (or 22'), and via holes 32 are formed in the insulation layer 22 (or 22') at sites at which the wiring lines 24 (or 24') on the core substrate 20 are to be connected to wiring lines to be subsequently formed on the insulation layer 22 (or 22'). The insulation layer 22 (or 22') is formed by laminating a resin film onto the core substrate 20, with the resin film being made of a material having electrical insulating properties, such as an epoxy. During the laminating, the holes 26 and 26a are filled with the resin material 22a of the laminating film. This method of filling the holes 26 and 26a with the resin material 22a of the laminating film is simpler than a method of filling the holes 26 and 26a with a filling material, such as a resin material, prior to the formation of the insulation layers 22, 22'. As an alternative to the laminating of a resin film, a resin material, such as an epoxy, may be coated onto the core substrate 20 to form the insulation layers 22, 22'.

Methods of forming the via holes 32 in the insulation layers 22, 22' include those in which a laser beam or chemical etching is employed. By forming the via holes 32, parts of the wiring lines in the underlying layer are exposed at the bottoms of the via holes 32.

Referring to FIG. 4D, a continuous conductor layer 34 (or 34') is formed, at each side of the core substrate 20, so as to cover the bottoms and inside walls of the via holes 32 and the surface of the insulation layer 22 (or 22'). The conductor layer 34, 34' can be formed by forming a thin conductor film on the bottoms and inside walls of the via holes 32 and the surfaces of the respective insulation layers 22, 22' of copper by electroless plating or sputtering, and then electroplating the thin conductor film with copper using the film as an electrical power-supply layer.

The conductor layers 34, 34' are then etched to provide patterned wiring lines 24, 24' on the respective insulation layers 22, 22', as shown in FIG. 4E. The formed wiring lines 24, 24' are connected through a via 30, which represents part of the conductor layer 22 (or 22') deposited on the inside wall and bottom of the via hole 32, to the wiring lines 24, 24' located on the surfaces of the core substrate 20.

The patterned wiring lines 24, 24' on the insulation layers 22, 22' can be formed by, for example, a method in which the conductor layer 34 (or 34') is formed on each of the insulation layers 22, 22', after which a layer of resist material having a pattern corresponding to a pattern of the wiring lines 24 (or 24') is formed, and the conductor layer 34 (or 34') is etched using the resist layer as a mask to thereby provide the patterned wiring lines 24 (or 24'), or a method in which a conductor layer serving as an electric power-supply layer is formed on each of the insulation layers 22, 22', after which a layer of resist material having a pattern, which exposes sites of the conductor layer on which the wiring lines 24 (or 24') are subsequently deposited, is formed, the exposed sites of the conductor layer are electroplated with copper using the electric power-supply layer to form the wiring lines 24 (or 24') having a desired thickness, the resist layer is then removed, and the electric power-supply layer, which has a substantially small thickness compared to that of the formed wiring lines, is removed by etching.

For the formation of two or more layers of wiring lines at each of the two sides of the core substrate 20, the procedure as described above with reference to FIGS. 4C to 4E can be repeated. FIG. 5A illustrates the core substrate 20 provided on each side thereof with two sets of insulation layer 22 (or 22') and wiring line layer 24 (or 24').

After the formation of a desired number of sets of insulation layer 22 (or 22') and wiring line layer 24 (or 24') at each of the two sides of the core substrate 20, by such a build-up process as described above, bores 11 (or 11') are formed in a stack or laminate of built-up insulation layers 22 (or 22') by partially removing the insulation layers 22 (or 22') so as to piercing through the laminate to thereby provide bores 11 (or 11') which expose the land 10 at their bottom, and the resin material 22a filled in the hole 26a, in which the lead pins of the mounted parts are subsequently inserted, is removed, as illustrated in FIG. 5B. This is a characteristic feature of the method of producing a substrate for mounting electronic parts thereon of the embodiment of the invention as set forth above.

The bores 11, 11' exposing the lands 10 at their bottoms may be formed using a laser beam, as in the formation of the via holes 32. The resin material 22a in the holes 26a may be removed by irradiating the material 22a in the holes 26a with a laser beam after the exposure of the lands 10. Conditions of the irradiation of laser beam can be controlled so that the lands 10 are not removed during the removal of the resin material 22a in the holes 26a.

Figure 6A:
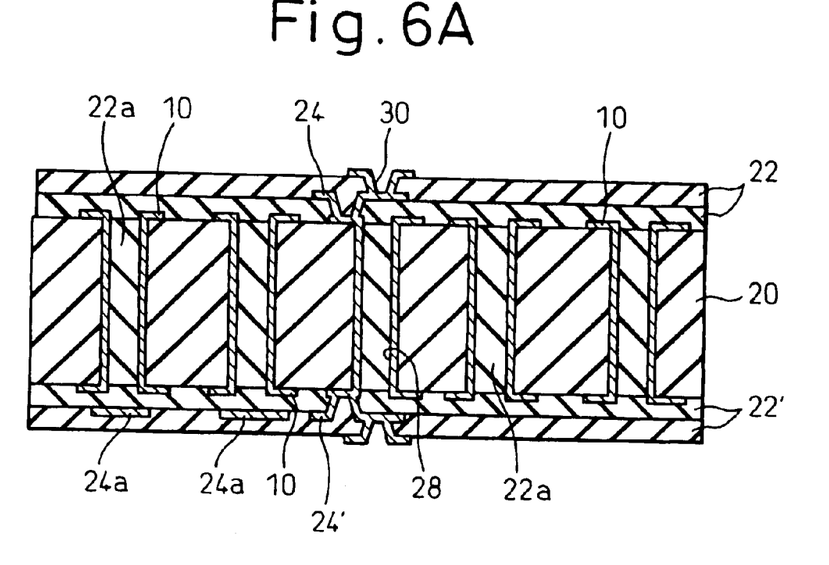
FIG. 6A illustrates a core substrate provided with stoppers to prevent excess removal of a material of an insulation layer during the removal of a resin material filled in holes in which lead pins of an electronic part are to be inserted.
Figure 6B:
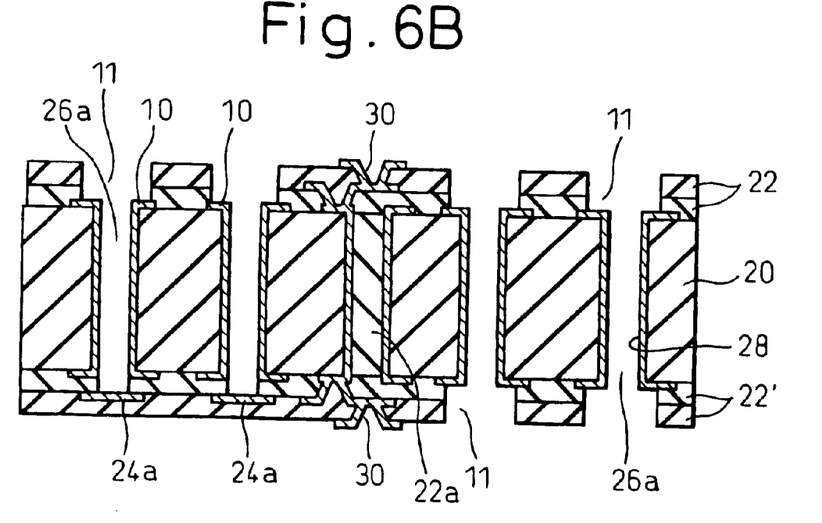
FIG. 6B illustrates a substrate according to the invention produced using the stoppers shown in FIG. 6A.

FIG. 5B shows two types of holes 26a for the insertion of the lead pins of the mounted parts; one is a hole having two open ends, and the other is a hole having an open end at the upper side of the core substrate 20 and a closed end at the lower side of the core substrate 20. The hole having two open ends can be obtained by removal of the laminates of insulation layers 22, 22' at both sides of the core substrate 20 and complete or substantially complete removal of the resin material 22a in the hole 26a. The hole having open and closed ends, as shown in FIG. 5B, can be obtained by removing only the laminate of insulation layers 22 at the upper side of the core substrate 20 to make the bore 11, and then removing the resin material 22a in the hole 26a using a laser beam. In this case, to appropriately terminate the removal of resin material 22a in the hole 26a without excessively removing the insulation layer 22', the energy of a laser beam used may be adjusted. Alternatively, parts of the conductor layer 24' formed on the insulation layer 22' are left behind, as stoppers 24a for the removal by a laser beam, at locations corresponding to the holes 26a during the patterning of the conductor layer 34', as illustrated in FIG. 6A. In the subsequent removal of the material 22a in the holes 26a, the removal of the material of the insulation layer 22' underlying the stopper 24a is effectively prevented, and a substrate according to the invention having both types of holes 26a referred to above can be obtained, as illustrated in FIG. 6B. Alternatively, a stopper metal layer may be provided in advance at the bottom end of the hole 26a. The stopper metal layer at the bottom end of the holes 26a may be provided by forming, after the filling of the holes 26 and 26a with a resin material, a metal layer on the entire surface of the core substrate 20 by successive electroless plating and electroplating with copper, and then etching the metal layer to simultaneously form the stopper metal layer (not shown) at the bottom end of the holes 26a and the patterned wiring lines 24, 24' and lands 10 on the core substrate 20. In the subsequent removal of the material 22a in the holes 26a, the removal is effectively stopped at the stopper metal layer, and a substrate according to the invention having both types of holes 26a referred to above can be also obtained.

The formation of the bore 11, 11' and the removal of the resin material 22a in the holes 26a can be accomplished by chemical etching, in place of a laser beam as described above.

The use of laser beam for these purposes has an advantage that the resin material 22a in the holes 26a can be easily removed using a laser beam used for the formation of the via holes 32 in the insulation layers 22, 22' when the holes 26a, in which the lead pins of the mounted parts are to be inserted, is filled with a resin material, such as an epoxy, of a film laminated to the core substrate 20 for the formation of the insulation layers 22, 22'. Of course, even when the holes 26a are filled with a resin material other than the material of the insulation layers 22, 22', the resin material in the holes 26a can be removed by a laser beam.

The method according to the invention, in which a set or sets of the insulation layer 22 (or 22') and the wiring line layer 24 (or 24') are formed on each of two sides of the core substrate 20 by a build-up process, and the formed insulation layer or a laminate of insulation layers 22 (or 22') is then processed to have the bores 11 (or 11') which expose the land 10 at their bottoms, makes it possible to simultaneously form the hole 26, which pierces through the core substrate 20 for the connection of a wiring line 24 at one side of the core substrate 20 and a wiring line 24' at the other side, and the holes 26a, in which the lead pins of the mounted parts are to be inserted. Thus, the method has advantages such that there is no need for the holes 26a to be formed in a step subsequent to the formation of the hole 26, the conductor layers on the inside wall of the holes 26a can be formed simultaneously with the conductor layer on the inside wall of the hole 26, and a process for forming the via holes 32 in the insulation layers 22, 22' may be applied to a processes for providing the bores 11, 11' in the insulation layer or the laminate of insulation layers 22, 22' and for removing the material 22a filled in the holes 26a.

Also, in the method according to the invention, since the patterned wiring lines 24, 24' can be formed using a build-up process, they can have very fine and small patterns.

Furthermore, in the case where an electronic part or parts 6 are mounted only on one side of the substrate 1, 2, 3 of the invention, as illustrated in FIGS. 1 to 3, extra wiring lines can be provided on the insulation layers 22' at the bottom side of the core substrate 20 so as to be located at areas at which the end bottoms of the holes 26a are closed by the insulation layer 22' (although such extra wiring lines are not shown in the drawings), which can enhance a degree of freedom of the patterns of the wiring lines 24' at the side of the substrate 1, 2, 3, on which no electrical parts are mounted.

In addition, although the wiring lines are provided at the two sides of the core substrate 20 in the embodiments of the invention illustrated in FIGS. 1 to 3, wiring lines may be provided only at one side of the core substrate 20. In such a case, a hole, such as the hole 26 shown in FIGS. 1 to 3, piercing through the core substrate 20 for the connection of a wiring line at one side of the core substrate 20 and a wiring line at the other side is no longer required. Also, although the substrate 1, 2, 3 shown in FIGS. 1 to 3 has a single hole 26 piercing through the core substrate 20 to connect wiring lines at two sides of the core substrate 20 to each other, the substrate 1, 2, 3 may have two or more holes 26 for the connection of wiring lines at the two sides of the core substrate 20.

As described, according to the invention, bores are provided in an insulation layer or a laminate of insulation layers of a substrate for mounting an electronic part thereon, so as to expose lands, to which a lead pin of the electronic part is to be bonded by solder, at the bottoms thereof. Consequently, short-circuit between adjacent lead pins through the solder after the bonding between the lead pins and the lands can be certainly prevented, and a substrate for mounting an electronic part having patterned wiring lines formed at high density can be provided. Also, such a substrate can be produced with high precision.

What is claimed is:

1. A substrate for mounting an electronic part or parts thereon comprising a core substrate and at least a set of insulation layer and a patterned wiring line layer which is formed on the insulation layer, said set of insulation layer and patterned wiring line layer being positioned at at least one of two opposed sides of the core substrate, the core substrate having holes, in each of which a lead pin of the electronic part is to be inserted, and said core substrate being provided with lands which surround an opening of each of the holes and to which the lead pin inserted in the hole is to be bonded, wherein the insulation layer or insulation layers located at at least one side of the core substrate has bores having a diameter larger than the diameter of the holes so as to expose the land and communicate with the hole surrounded by the land, at the bottom of the bores;

wherein the holes, in which the lead pin of the electronic part is to be inserted, have a closed end at the side of the core substrate opposed to the side on which the electronic parts are to be mounted and the holes have an inside wall on which a conductor layer is formed, the conductor layer being led to the land.

2. The substrate for mounting an electronic part or parts thereon according to claim 1, further comprising lands which surround the opening of the hole at the side of the core substrate opposed to the side on which the electronic parts are to be mounted, and which are led to the conductor layer on the inside wall of the hole.

3. The substrate for mounting an electronic part or parts thereon according to claim 2, wherein the land at the side of the core substrate opposed to the side on which the electronic parts are to be mounted is connected to a wiring line at this side.

4. The substrate for mounting an electronic part or parts thereon according to claim 1, wherein the closed end is closed by the insulation layer on the core substrate, a metal layer provided at the end of the hole, or a metal film formed during the formation of the wiring line layer.

5. The substrate for mounting an electronic part or parts thereon according to claim 1, wherein a wiring line is provided on the insulation layer at an area corresponding to the location of the hole with the closed end.

6. The substrate for mounting an electronic part or parts thereon according to claim 1, further comprising a hole piercing through the core substrate and having an inside wall on which an conductor layer is provided to connect a wiring line at one side of the core substrate to another wiring line at the opposed side.

7. A substrate for mounting an electronic part or parts thereon comprising a core substrate and at least a set of insulation layer and a patterned wiring line layer which is formed on the insulation layer, said set of insulation layer and patterned wiring line layer being positioned at at least one of two opposed sides of the core substrate, the core substrate having holes, in each of which a lead pin of the electronic part is to be inserted, and said core substrate being provided with lands which surround an opening of each of the holes and to which the lead pin inserted in the hole is to be bonded, wherein the insulation layer or insulation layers located at at least one side of the core substrate has bores having a diameter larger than the diameter of the holes so as to expose the land and communicate with the hole surrounded by the land, at the bottom of the bores;

wherein at least one of the holes, in which the lead pin of the electronic part is to be inserted, has an open end at the side of the core substrate opposed to the side on which the electronic parts are to be mounted, and at least one of the holes, in which the lead pin of the electronic part is to be inserted, has a closed end at the side of the core substrate opposed to the side on which the electronic parts are to be mounted.

8. The substrate for mounting an electronic part or parts thereon according to claim 7, wherein the closed end is closed by the insulation layer on the core substrate, a metal layer provided at the end of the hole, or a metal film formed during the formation of the wiring line layer.

9. The substrate for mounting an electronic part or parts thereon according to claim 7, wherein a wiring line is provided on the insulation layer at an area corresponding to the location of the hole with the closed end.

10. The substrate for mounting an electronic part or parts thereon according to claim 7, wherein the hole, in which the lead pin of the electronic part is to be inserted, has an inside wall on which a conductor layer is formed, the conductor layer being led to the land.

11. The substrate for mounting an electronic part or parts thereon according to claim 10, further comprising lands which surround the opening of the hole at the side of the core substrate opposed to the side on which the electronic parts are to be mounted, and which are led to the conductor layer on the inside wall of the hole.

12. The substrate for mounting an electronic part or parts thereon according to claim 11, wherein the land at the side of the core substrate opposed to the side on which the electronic parts are to be mounted is connected to a wiring line at said side.

13. The substrate for mounting an electronic part or parts thereon according to claim 7, further comprising a hole piercing through the core substrate and having an inside wall on which a conductor layer is provided to connect a wiring line at one side of the core substrate to another wiring line at the opposed side.

14. A method of manufacturing a substrate for mounting an electronic part or parts thereon, comprising a core substrate and at least a set of insulation layer and patterned wiring line layer, which is formed on the insulation layer, at at least one sides of the core substrate, the core substrate having holes, in each of which a lead pin of the electronic part to be mounted is to be inserted, and being provided with lands which surround the opening of the hole and to which the lead pin inserted in the hole is to be bonded, and holes having an inside wall on which a conductor layer is formed, the conductor layer extending to a land provided on each of the sides of the core substrate in order to connect a wiring line at one side of the core substrate to another wiring line at the opposed side, the land surrounding the opening of the hole in which a lead pin of the electronic part is to be inserted, wherein the insulation layer or layers have bores having a diameter larger than the diameter of the holes so as to expose the land and communicate with the holes, at a bottom of the bores, and the lands connected to the wiring lines are covered with the insulation layer, the method comprising the following steps:
providing a core substrate,
forming holes piercing the core substrate,
forming, on the core substrate and around the ends of the holes, lands for the connection with the lead pin of the electronic parts to be mounted, and lands for the connection with the wiring line layers,
filling the holes with a filling material,
forming at least a set of insulation layer and patterned wiring line layer, which is
formed on the insulation layer, at at least one side of the core substrate,
forming bores piercing through the resultant insulation layer or layers at the side of the core substrate on which the electronic part or parts are to be mounted, and exposing the land at the bottom of the bores, and
removing the filling material in the holes, in which a lead pin of the electronic part is to be inserted, to allow each of the holes to communicate with each of the bores.

15. The method according to claim 14, wherein the formation of the bores and the removal of the filling material in the holes is carried out using a laser beam.

16. The method according to claim 14, wherein the formation of the bores and the removal of the filling material in the holes is carried out by chemical etching.

17. A substrate for mounting an electronic pan or parts thereon, comprising a core substrate and at least a set of insulation layer and patterned wiring line layer, which is formed on the insulation layer, at opposed sides of the core substrate, the core substrate having holes, in each of which a lead pin of the electronic part to be mounted is to be inserted, and being provided with lands which surround an opening of the hole and to which the lead pin inserted in the hole is to be bonded, and holes having an inside wall on which a conductor layer is formed, the conductor layer being led to the land and the conductor layer extending to a land provided on each of the sides of the core substrate in order to connect a wiring line at one side of the core substrate to another wiring line at the opposed side, wherein the insulation layer or layers have bores having a diameter larger than the diameter of the holes so as to expose the land at a bottom of the bore, said land surrounding the opening of the hole in which a lead pin of the electronic part is to be inserted such that said bore communicates with the hole, and the lands connected to the wiring lines are covered with the insulation layer.

* * * * *